United States Patent
Liu

(10) Patent No.: US 10,490,777 B2
(45) Date of Patent: Nov. 26, 2019

(54) OLED DISPLAY AND MANUFACTURING METHOD THEREOF

(71) Applicant: Wuhan China Star Optoelectronics Semiconductor Display Technology Co., Ltd., Wuhan, Hubei (CN)

(72) Inventor: Sheng Liu, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/767,615

(22) PCT Filed: Mar. 12, 2018

(86) PCT No.: PCT/CN2018/078682
§ 371 (c)(1),
(2) Date: Apr. 11, 2018

(87) PCT Pub. No.: WO2019/148594
PCT Pub. Date: Aug. 8, 2019

(65) Prior Publication Data
US 2019/0237707 A1 Aug. 1, 2019

(30) Foreign Application Priority Data
Jan. 31, 2018 (CN) .......................... 2018 1 0093540

(51) Int. Cl.
*H01L 51/52* (2006.01)
*H01L 27/32* (2006.01)

(52) U.S. Cl.
CPC ...... *H01L 51/5284* (2013.01); *H01L 27/3211* (2013.01); *H01L 51/5256* (2013.01); *H01L 27/322* (2013.01)

(58) Field of Classification Search
CPC ... H01L 27/323; H01L 51/56; H01L 51/5246; H01L 27/3272; G06F 1/1652
(Continued)

(56) References Cited

U.S. PATENT DOCUMENTS

2014/0117324 A1* 5/2014 Kim ...................... H01L 27/323
257/40
2016/0146988 A1 5/2016 Kim et al.

FOREIGN PATENT DOCUMENTS

CN 1426269 A 6/2003
CN 105304686 A 2/2016
(Continued)

*Primary Examiner* — Thinh T Nguyen
(74) *Attorney, Agent, or Firm* — Leong C. Lei

(57) ABSTRACT

An organic light emitting diode (OLED) display is disclosed, which includes a substrate, an OLED device having red, green, and blue light emitting layers on the substrate; an encapsulation layer on the OLED device; a lid on the encapsulation layer; and a band-pass filter device between the OLED device and the lid. The band-pass filter device includes red, green, and blue light band-pass filter films. The red light band-pass filter film is disposed oppositely to the red light emitting layer, the green light band-pass filter film is disposed oppositely to the green light emitting layer, and the blue light band-pass filter film is disposed oppositely to the blue light emitting layer. An OLED display manufacturing method is also disclosed. The present invention is able to reduce the damage caused by the ambient light on the light emitting layers so as to enhance their operation lives, color saturation, and contrast.

10 Claims, 5 Drawing Sheets

(58) Field of Classification Search
USPC .............. 257/40, 59, 72; 438/82, 99, 48, 128
See application file for complete search history.

(56) References Cited

FOREIGN PATENT DOCUMENTS

| | | |
|---|---|---|
| CN | 105990395 A | 10/2016 |
| CN | 106328825 A | 1/2017 |
| JP | 2006-269252 A | 10/2006 |

* cited by examiner understand# OLED DISPLAY AND MANUFACTURING METHOD THEREOF

RELATED APPLICATIONS

The present application is a National Phase of International Application Number PCT/CN2018/078682, filed Mar. 12, 2018, and claims the priority of China Application No. 201810093540.7, filed Jan. 31, 2018.

BACKGROUND OF THE INVENTION

(a) Technical Field of the Invention

The present invention is generally related to Organic Light emitting Diodes (OLEDs), and more particular to an OLED display and its manufacturing method.

(b) Description of the Prior Art

As a promising planar display product, Organic Light emitting Diode (OLED) displays are widely popular in recent years, due to their self-illumination, wide viewing angle, short response time, high lighting efficiency, wide color gamut, thin thickness, simple manufacturing process, and potentials for large scale and bendable display. OLED displays also have a lower cost.

However, outdoor OLED displays, as high brightness and long operation time are required, usually consume more power and suffer low contrast and shortened operation life. These are mainly resulted from that OLED displays would absorb ambient light where high energy components in the natural light would excite the organic material of the OLED displays, causing the organic material to prematurely deteriorate and thereby shortening the operation life of OLED displays.

SUMMARY OF THE INVENTION

To resolve the above problems, an objective of the present invention is to provide an organic light emitting diode (OLED) display with prolonged operation life and its manufacturing method.

The OLED display includes a substrate, an OLED device having red, green, and blue light emitting layers on the substrate; an encapsulation layer on the OLED device; a lid on the encapsulation layer; and a band-pass filter device between the OLED device and the lid. The band-pass filter device includes red, green, and blue light band-pass filter films. The red light band-pass filter film is disposed oppositely to the red light emitting layer, the green light band-pass filter film is disposed oppositely to the green light emitting layer, and the blue light band-pass filter film is disposed oppositely to the blue light emitting layer.

Further, the band-pass filter device is disposed between the OLED device and the encapsulation layer.

Further, the band-pass filter device is disposed between the encapsulation layer and the lid.

Further, the encapsulation layer includes multiple inorganic layers and organic layers alternately stacked. The red, green, and blue light band-pass filter films of the band-pass filter device are disposed between adjacent inorganic and organic layers in one of the following manners: (1) the red, green, and blue light band-pass filter films are altogether disposed between a pair of adjacent inorganic and organic layers, (2) one of the red, green, and blue light band-pass filter films is disposed between a pair of adjacent inorganic and organic layers and the other two are disposed between another pair of adjacent inorganic and organic layers, and (3) the red, green, and blue light band-pass filter films are respectively disposed between different pairs of adjacent inorganic and organic layers.

Further, the encapsulation layer includes multiple inorganic layers and organic layers alternately stacked. When the red, green, and blue light band-pass filter films are made of an organic material, they are embedded within the organic layers in one of the following manners: (1) the red, green, and blue light band-pass filter films are altogether embedded within an organic layer; (2) one of the red, green, and blue light band-pass filter films is embedded within an organic layer and the other two are embedded within another organic layer, and (3) the red, green, and blue light band-pass filter films are respectively embedded within different organic layers. When the red, green, and blue light band-pass filter films are made of an inorganic material, they are embedded within the inorganic layers in one of the following manners: (1) the red, green, and blue light band-pass filter films are altogether embedded within an inorganic layer; (2) one of the red, green, and blue light band-pass filter films is embedded within an inorganic layer and the other two are embedded within another inorganic layer, and (3) the red, green, and blue light band-pass filter films are respectively embedded within different inorganic layers.

Further, the red light band-pass filter film has a transparent band between wavelengths R1 and R2, the red light emitting layer peaks at wavelength R0, and R1=R0−20 nm, R2=R0+20 nm. The green light band-pass filter film has a transparent band between wavelengths G1 and G2, the green light emitting layer peaks at wavelength G0, and G1=G0−15 nm, G2=G0+15 nm. The blue light band-pass filter film has a transparent band between wavelengths B1 and B2, the blue light emitting layer peaks at wavelength B0, and B1=B0−10 nm, B2=B0+10 nm.

The OLED display further includes a circular polarizer between the OLED device and the band-pass filter device.

The band-pass filter device further includes a transparent sheet. The red, green, and blue light band-pass filter films are formed on the transparent sheet.

The OLED display manufacturing method includes the steps of forming an OLED device on a substrate, where the OLED device includes a red light emitting layer, a green light emitting layer, and a blue light emitting layer; forming an encapsulation layer on the OLED device; forming a band-pass filter device on a side of a lid, where the band-pass filter device includes a red light band-pass filter film, a green light band-pass filter film, and a blue light band-pass filter film; and joining the lid, together with the band-pass filter device, to the encapsulation layer with the red, green, and blue light band-pass filter films corresponding oppositely to the red, green, and blue light emitting layers, respectively.

Another OLED display manufacturing method includes the steps of forming an OLED device on a substrate, where the OLED device includes a red light emitting layer, a green light emitting layer, and a blue light emitting layer; forming an encapsulation layer on the OLED device; forming a red light band-pass filter film, a green light band-pass filter film, and a blue light band-pass filter film, jointly as a band-pass filter device, on a side of a transparent sheet; disposing the transparent sheet with the band-pass filter device on the encapsulation layer and with the red, green, and blue light band-pass filter films correspond oppositely to the red, green, and blue light emitting layers, respectively; and covering the band-pass filter device by a lid.

The advantages of the present invention are that the display is able to reduce the damage caused by the ambient light on the light emitting layers so as to enhance their operation lives, color saturation, and contrast.

The foregoing objectives and summary provide only a brief introduction to the present invention. To fully appreciate these and other objects of the present invention as well as the invention itself all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

Figure 1:
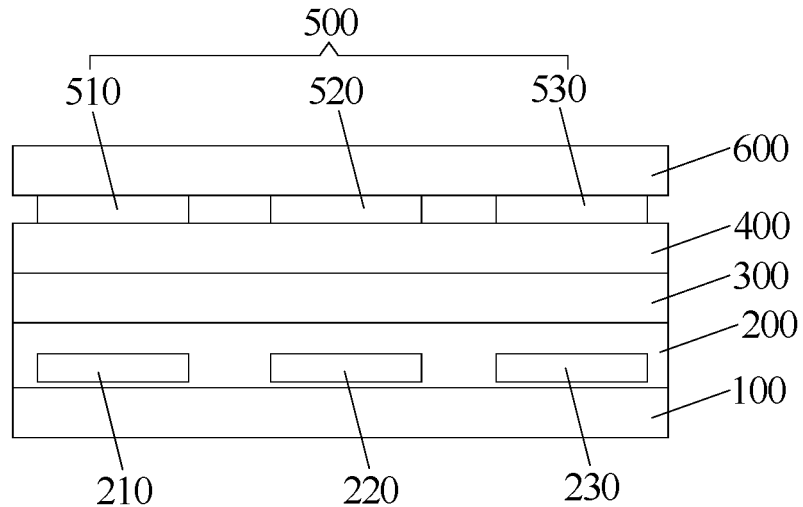
FIG. 1 is a sectional schematic diagram showing an Organic Light emitting Diode (OLED) display according to an embodiment of the present invention.

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

In the drawings, for clarity's sake, thickness of layers and regions is exaggerated. Same reference numbers refer to identical components.

It should be understandable that, when a first element are described as being "on" a second element, the first element may be immediately on a side of the second element, or some intermediate element may be present between the first and second elements. However, when the first element is said to be "immediately on" the second element, there is no intermediate element in between.

FIG. 1 is a sectional schematic diagram showing an Organic Light emitting Diode (OLED) display according to an embodiment of the present invention.

As illustrated, the OLED display of the present embodiment includes a substrate 100, an OLED device 200, an encapsulation layer 300, an anti-reflection sheet 400, a band-pass filter device 500, and a lid 600.

Specifically, the substrate 100 is a glass substrate, but the present invention is not limited as such.

The OLED device 200 is disposed on the substrate 100. In the present embodiment, the OLED device 200 at least includes a red light emitting layer 210, a green light emitting layer 220, and a blue light emitting layer 230. In FIG. 1, only one red light emitting layer 210, one green light emitting layer 220, and one blue light emitting layer 230 are shown. The present invention does not require a specific number of these light emitting layers. A red light emitting layer 210, a green light emitting layer 220, and a blue light emitting layer 230 constitute a pixel unit.

In other words, the OLED device 200 of the present invention may include multiple pixel units (not shown), and these pixels may be arranged according to a pattern such as into an array. Each pixel unit includes a red light emitting layer 210, a green light emitting layer 220, and a blue light emitting layer 230.

In the present embodiment, the OLED device 200 is shown to include red, green, and blue light emitting layers 210, 220, and 230. However, the present invention is not limited as such. For example, the OLED device 200 may also include anode, cathode, electron transport layer, hole transport layer, electron injection layer, hole injection layer, etc.

The encapsulation layer 300 is disposed on the OLED device to shield outside moist and oxygen to prevent the OLED device 200, specifically the various light emitting layers, from being eroded by the moist and oxygen.

The anti-reflection sheet 400 is disposed on the encapsulation layer 300 to reduce or eliminate the interference to the displayed images by ambient light, to remove reflection, and to avoid the problem that dark images are not dark enough, and to enhance contrast. The anti-reflection sheet 400 may be a circular polarizer made from stacking linear polarizer and ¼ wave plate. However, the present invention is not limited as such. The anti-reflection sheet 400 is for enhancing the quality of displayed images. In alternative embodiments, the anti-reflection sheet 400 may be omitted.

The band-pass filter device 500 is disposed on the anti-reflection sheet 400. In the present embodiment, the band-pass filter device 500 includes a red light band-pass filter film 510, a green light band-pass filter film 520, and a blue light band-pass filter film 530. The red light band-pass filter film 510 is disposed oppositely to the red light emitting layer 210, the green light band-pass filter film 520 is disposed oppositely to the green light emitting layer 220, and the blue light band-pass filter film 530 is disposed oppositely to the blue light emitting layer 230.

In the present embodiment, the band-pass filter device 500 is disposed on the anti-reflection sheet 400. However, the present invention requires only that the band-pass filter device 500 is above the OLED device 200. Therefore, in an alternative embodiment, the band-pass filter device 500 may be disposed immediately on the OLED device 200, or immediately on the encapsulation layer 300.

Figure 5:
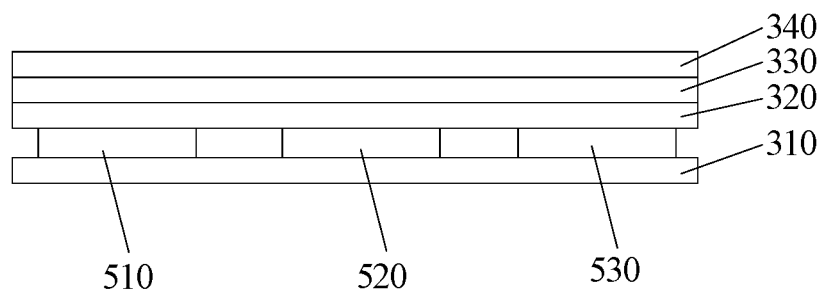
FIGS. 5 to 13 are sectional schematic diagrams showing various embodiments of the present invention where a band-pass filter device is embedded in an encapsulation layer.

The encapsulation layer 300 may be formed by alternately stacking multiple inorganic layers and organic layers. Then, the band-pass filter device 500 may be disposed immediately on the encapsulation layer 300, or within the encapsulation layer 300. FIG. 5 shows a first embodiment of disposing the band-pass filter device 500 within the encapsulation layer 300 that involves multiple inorganic and organic layers.

As shown in FIG. 5, the encapsulation layer 300 includes sequentially stacked first inorganic layer 310, first organic layer 320, second inorganic layer 330, and second organic layer 340.

The red light band-pass filter film 510, green light band-pass filter film 520, and blue light band-pass filter film 530 are disposed between the first inorganic and organic layers 310 and 320. Alternatively, the red light band-pass filter film 510, green light band-pass filter film 520, and blue light band-pass filter film 530 may also be disposed between the first organic layer 320 and the second inorganic layer 330, or between the second inorganic layer 330 and the second organic layer 340.

Figure 6:
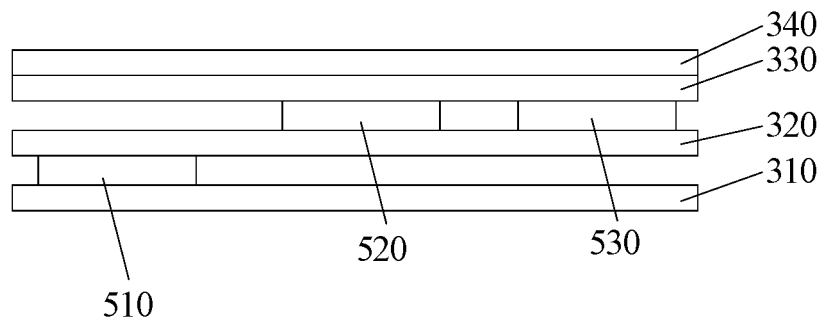

FIG. 6 shows a second embodiment of including the band-pass filter device within the encapsulation layer.

As illustrated, the encapsulation layer 300 includes sequentially stacked first inorganic layer 310, first organic layer 320, second inorganic layer 330, and second organic layer 340.

Here the red light band-pass filter film 510 is disposed between the first inorganic and organic layers 310 and 320, and the green light band-pass filter film 520 and blue light band-pass filter film 530 are disposed between the first organic layer 320 and the second inorganic layers 330. Alternatively, the green light band-pass filter film 520 and blue light band-pass filter film 530 may also be disposed between the second inorganic layer 330 and the second organic layer 340. In other words, one of the red light band-pass filter film 510, green light band-pass filter film 520, and blue light band-pass filter film 530 is disposed between a pair of adjacent inorganic and organic layers, and the other two films are disposed between another pair of adjacent inorganic and organic layers.

Figure 7:
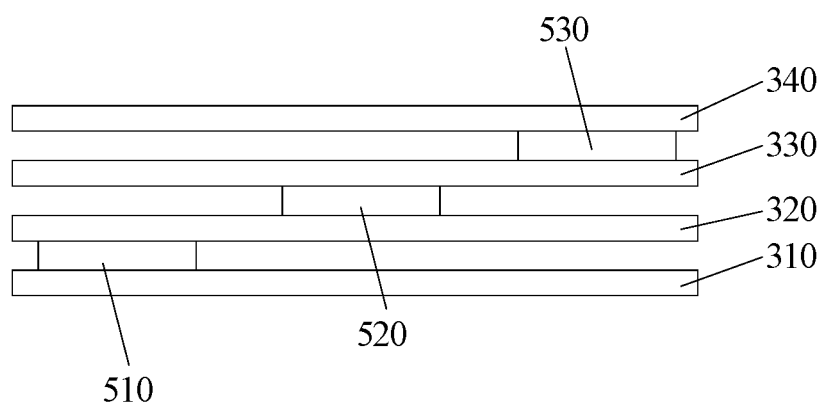

FIG. 7 shows a third embodiment of including the band-pass filter device within the encapsulation layer.

As illustrated, the encapsulation layer 300 includes sequentially stacked first inorganic layer 310, first organic layer 320, second inorganic layer 330, and second organic layer 340.

Here the red light band-pass filter film 510 is disposed between the first inorganic and organic layers 310 and 320. The green light band-pass filter film 520 is disposed between the first organic layer 320 and the second inorganic layers 330. The blue light band-pass filter film 530 is disposed between the second inorganic layer 330 and the second organic layer 340. Alternatively, the locations of the red, green, and blue light band-pass filter films 510, 520, and 530 are interchangeable. In other words, the red, green, and blue light band-pass filter films 510, 520, and 530 are respectively disposed between a different pair of adjacent inorganic and organic layers.

Figure 8:
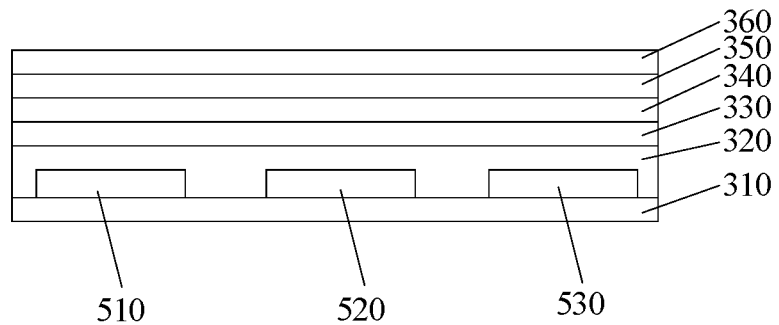

FIG. 8 shows a fourth embodiment of including the band-pass filter device within the encapsulation layer.

As illustrated, the encapsulation layer 300 includes sequentially stacked first inorganic layer 310, first organic layer 320, second inorganic layer 330, second organic layer 340, third inorganic layer 350, and third organic layer 360.

Here the red light band-pass filter film 510 is disposed between the first inorganic and organic layers 310 and 320. The green light band-pass filter film 520 is disposed between the first organic layer 320 and the second inorganic layers 330. The blue light band-pass filter film 530 is disposed between the second inorganic layer 330 and the second organic layer 340. Alternatively, the locations of the red, green, and blue light band-pass filter films 510, 520, and 530 are interchangeable. In other words, the red, green, and blue light band-pass filter films 510, 520, and 530 are respectively disposed between different pairs of adjacent inorganic and organic layers.

When the red, green, and blue light band-pass filter films 510, 520, and 530 are all made of an organic material, altogether they may be embedded within the first organic layer 320, within the second organic layer 340, or within the third organic layer 360.

Figure 9:
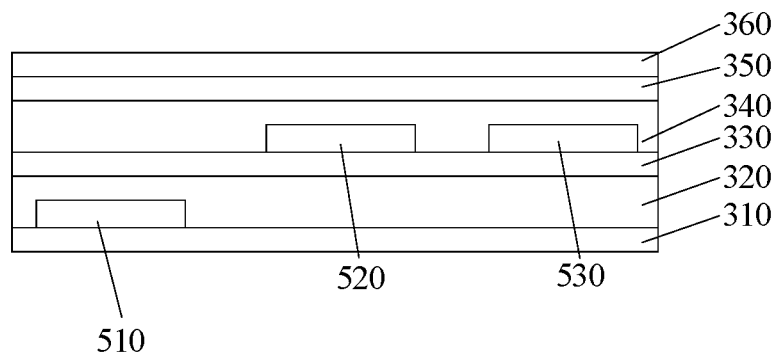
Figure 10:
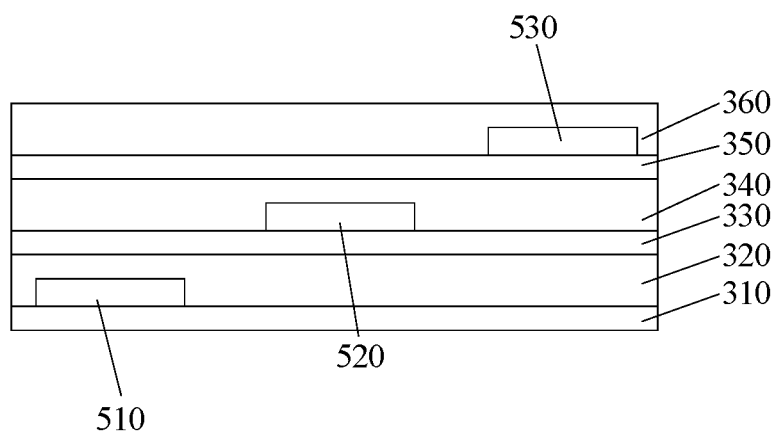

Alternatively, as shown in FIG. 9, the red light band-pass filter film 510 is embedded within the within the first organic layer 320, and the green and blue light band-pass filter films 520 and 530 are embedded within the second organic layer 340, or within the third organic layer 360. Alternatively, as shown in FIG. 10, the red, green, and blue light band-pass filter films 510, 520, and 530 are respectively embedded within the first, second, and third organic layers 320, 340, and 360.

Figure 11:
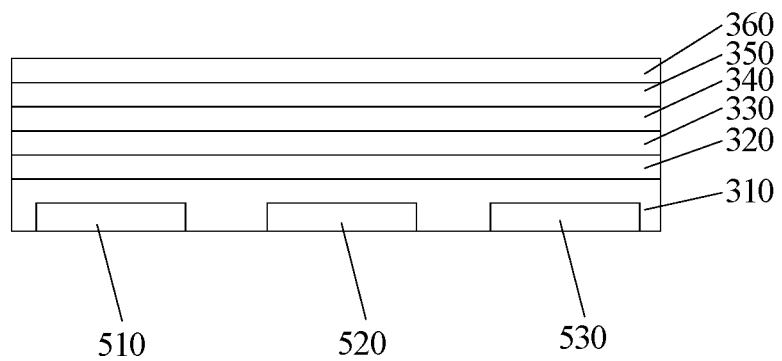

FIG. 11 shows yet another embodiment of including the band-pass filter device within the encapsulation layer.

As illustrated, the encapsulation layer 300 includes sequentially stacked first inorganic layer 310, first organic layer 320, second inorganic layer 330, second organic layer 340, third inorganic layer 350, and third organic layer 360.

When the red, green, and blue light band-pass filter films 510, 520, and 530 are all made of an inorganic material, altogether they may be embedded within the first inorganic layer 310, within the second inorganic layer 330, or within the third inorganic layer 350.

Figure 12:
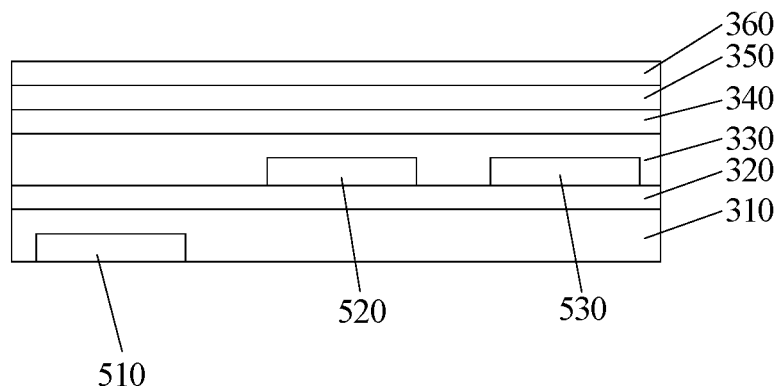
Figure 13:
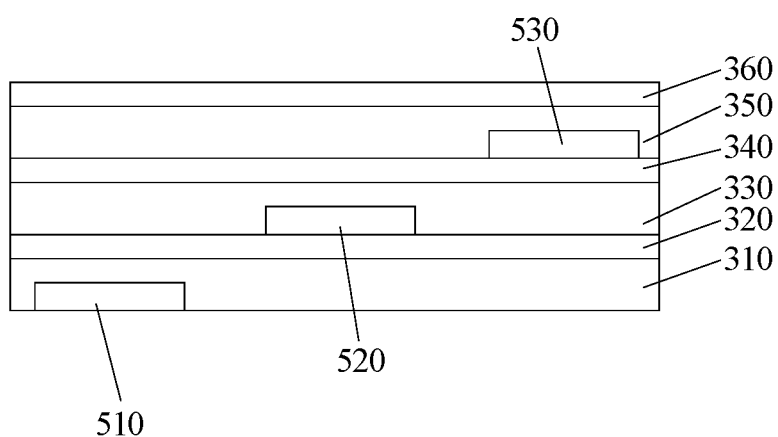

Alternatively, as shown in FIG. 12, the red light band-pass filter film 510 is embedded within the within the first inorganic layer 310, and the green and blue light band-pass filter films 520 and 530 are embedded within the second inorganic layer 330, or within the third inorganic layer 350. Alternatively, as shown in FIG. 13, the red, green, and blue light band-pass filter films 510, 520, and 530 are respectively embedded within the first, second, and third inorganic layers 310, 330, and 350.

Continuing with FIG. 1, the lid 600 is disposed on the band-pass filter device 500. In the present embodiment, the lid 600 is a glass lid, but the present invention is not limited as such.

The red, green, and blue light band-pass filter films 510, 520, and 530 have selective transparency. For example, only the red component within the ambient light may pass through the red light band-pass filter film 510. Similarly, the green and blue light band-pass filter films 520 and 530 allow only the green and blue components within the ambient light to pass through. As such, since the band-pass filter films respectively absorb a great majority of the ambient light, the corresponding light emitting layers may have greater operation lives.

In addition, when light from the respective light emitting layers passes through the corresponding band-pass filter films, as the band-pass filter films may absorb the marginal components, thereby purifying the light's gamut and enhancing the OLED device's color saturation.

Furthermore, when producing the red, green, and blue light band-pass filter films 510, 520, and 530, at least one of them has a thickness between 50 nm and 150 nm. The present invention is however not limited as such.

The red light band-pass filter film 510 has a transparent band (or high transparent band) between wavelengths R1 and R2, and the red light emitting layer 210 peaks at wavelength R0. Then R1=R0−Rx, R2=R0+Rx, where Rx is preferably 20 nm. For example, R0 is 650 nm, R1 is 610 nm, and R2 is 670 nm. However, the present invention is not limited as such and may be adjusted as required.

The green light band-pass filter film 520 has a transparent band (or high transparent band) between wavelengths G1 and G2, and the green light emitting layer 220 peaks at wavelength G0. Then G1=G0−Gx, G2=G0+Gx, where Gx is preferably 15 nm. For example, G0 is 532 nm, G1 is 517 nm, and G2 is 547 nm. However, the present invention is not limited as such and may be adjusted as required.

The blue light band-pass filter film 530 has a transparent band (or high transparent band) between wavelengths B1 and B2, and the blue light emitting layer 230 peaks at wavelength B0. Then B1=B0−Bx, B2=B0+Bx, where Bx is preferably 10 nm. For example, B0 is 430 nm, B1 is 420 nm, and B2 is 440 nm. However, the present invention is not limited as such and may be adjusted as required.

Figure 2:
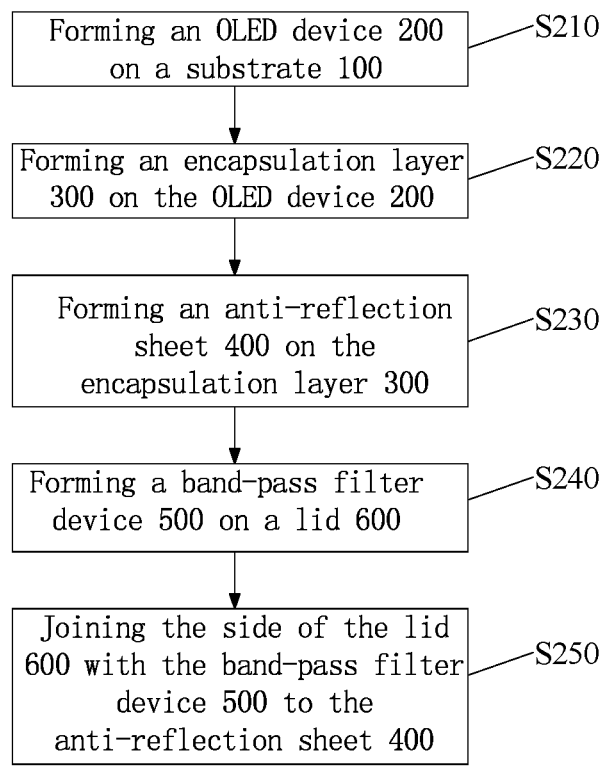
FIG. 2 is a flow diagram showing an OLED display manufacturing method according to an embodiment of the present invention.

FIG. 2 is a flow diagram showing an OLED display manufacturing method according to an embodiment of the present invention.

As shown in FIGS. 1 and 2, the manufacturing method of the present embodiment includes the following steps.

In step S210, an OLED device 200 is formed on a substrate 100. The OLED device 200 includes a red light emitting layer 210, a green light emitting layer 220, and a blue light emitting layer 230.

In step S220, an encapsulation layer 300 is formed on the OLED device 200.

In step S230, an anti-reflection sheet 400 is formed on the encapsulation layer 300. As mentioned above, the step S230 is omitted if the anti-reflection sheet 400 is omitted.

In step S240, a band-pass filter device 500 is formed on a side of a lid 600. The band-pass filter device 500 includes a red light band-pass filter film 510, a green light band-pass filter film 520, and a blue light band-pass filter film 530.

In step S250, the lid 600, together with the band-pass filter device 500, is joined to the anti-reflection sheet 400 with the band-pass filter device 500 sandwiched in between and with the red, green, and blue light band-pass filter films 510, 520, and 530 corresponding oppositely to the red, green, and blue light emitting layers 210, 220, and 230, respectively. When the step S230 is omitted, the lid 600 with the band-pass filter device 500 is joined to the encapsulation layer 300 as described above.

Figure 3:
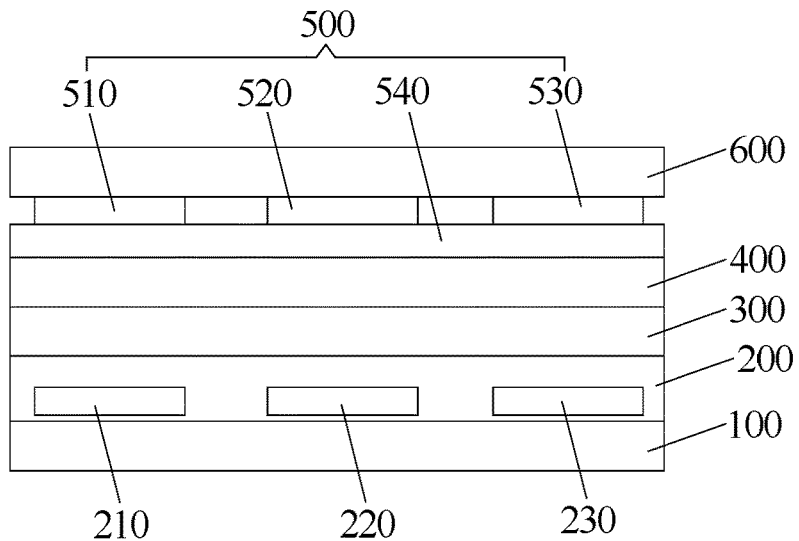
FIG. 3 is a sectional schematic diagram showing an OLED display according to another embodiment of the present invention.

FIG. 3 is a sectional schematic diagram showing an OLED display according to another embodiment of the present invention.

As illustrated, the present embodiment is different from the one shown in FIG. 1 in that the band-pass filter device 500 further includes a transparent sheet 540 on the anti-reflection sheet 400 and the red, green, and blue light band-pass filter films 510, 520, and 530 are sandwiched between the lit 600 and the transparent sheet 540. In the present embodiment, the transparent sheet 540 is a thin piece of glass but the present invention is not limited as such.

Alternatively, the band-pass filter device 500 is formed immediately on the OLED device 200, the transparent sheet 540 is disposed on the anti-reflection sheet 400. Or, when the band-pass filter device 500 is formed immediately on the encapsulation layer 300, the transparent sheet 540 is disposed on the encapsulation layer 300. Or, when the band-pass filter device 500 is embedded within the encapsulation layer 300, the transparent sheet 540, functioning as a carrier for the red, green, and blue light band-pass filter films 510, 520, and 530 may be embedded in the encapsulation layer 300 as well.

Figure 4:
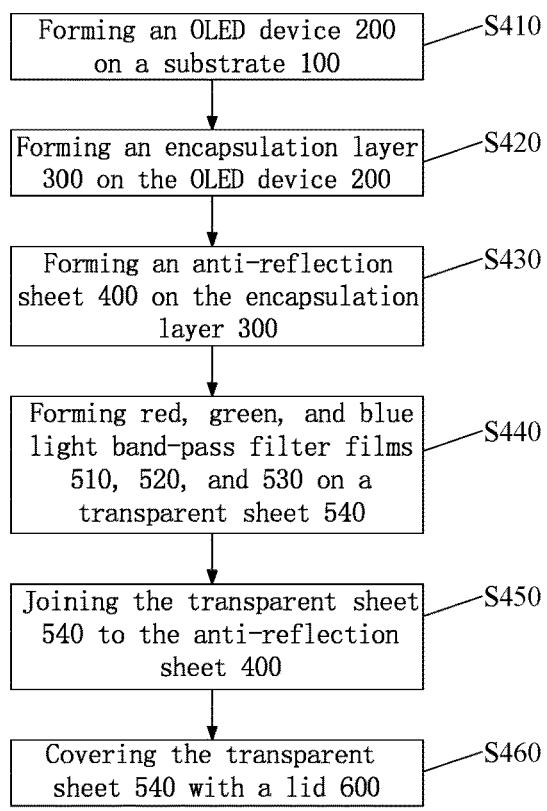
FIG. 4 is a flow diagram showing an OLED display manufacturing method according to another embodiment of the present invention.

FIG. 4 is a flow diagram showing an OLED display manufacturing method according to another embodiment of the present invention.

As shown in FIGS. 3 and 4, the manufacturing method of the present embodiment includes the following steps.

In step S410, an OLED device 200 is formed on a substrate 100. The OLED device 200 includes a red light emitting layer 210, a green light emitting layer 220, and a blue light emitting layer 230.

In step S420, an encapsulation layer 300 is formed on the OLED device 200.

In step S430, an anti-reflection sheet 400 is formed on the encapsulation layer 300. As mentioned above, the step S230 is omitted if the anti-reflection sheet 400 is omitted.

In step S440, a red light band-pass filter film 510, a green light band-pass filter film 520, and a blue light band-pass filter film 530, jointly as a band-pass filter device 500, is formed on a side of a transparent sheet 540.

In step S450, the transparent sheet 540 has the side with the band-pass filter device 500, or an opposing side opposite to the side with the band-pass filter device 500, joined to the anti-reflection sheet 400. The red, green, and blue light band-pass filter films 510, 520, and 530 correspond oppositely to the red, green, and blue light emitting layers 210, 220, and 230, respectively. When the step S430 is omitted, the transparent sheet 540 is joined to the encapsulation layer 300 as described above.

In step S460, the transparent sheet 540 is covered by a lid 600.

As described in the embodiments above, the present invention is able to reduce the damage caused by the ambient light on the light emitting layers so as to enhance their operation lives. In the meantime, their color saturation and contrast are also improved.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the claims of the present invention.

What is claimed is:

1. An organic light emitting diode (OLED) display, comprising
    a substrate;
    an OLED device on the substrate comprising a red light emitting layer, a green light emitting layer, and a blue light emitting layer;
    an encapsulation layer on the OLED device;
    a lid on the encapsulation layer; and
    a band-pass filter device between the OLED device and the lid comprising a red light band-pass filter film, a green light band-pass filter film, and a blue light band-pass filter film; wherein the red light band-pass filter film has a transparent band between wavelengths R1 and R2; the red light emitting layer peaks at wavelength R0; R1=R0−20 nm; R2=R0+20 nm; the green light band-pass filter film has a transparent band between wavelengths G1 and G2; the green light emitting layer peaks at wavelength G0; G1=G0−15 nm, G2=G0+15 nm; the blue light band-pass filter film has a transparent band between wavelengths B1 and B2; the blue light emitting layer peaks at wavelength B0; B1=B0−10 nm; and B2=B0+10 nm;
    wherein the red light band-pass filter film is disposed oppositely to the red light emitting layer; the green light band-pass filter film is disposed oppositely to the green light emitting layer; and the blue light band-pass filter film is disposed oppositely to the blue light emitting layer; wherein the OLED display further includes an anti-reflection sheet disposed on the encapsulation layer to remove reflection of ambient light.

2. The OLED display according to claim 1, wherein the band-pass filter device is disposed between the OLED device and the encapsulation layer.

3. The OLED display according to claim 1, wherein the band-pass filter device is disposed between the encapsulation layer and the lid.

4. The OLED display according to claim 1, wherein the encapsulation layer comprises a plurality of inorganic layers and organic layers alternately stacked; and the red, green, and blue light band-pass filter films of the band-pass filter device are disposed between adjacent inorganic and organic layers in one of the following manners: (1) the red, green, and blue light band-pass filter films are altogether disposed between a pair of adjacent inorganic and organic layers, (2) one of the red, green, and blue light band-pass filter films is disposed between a pair of adjacent inorganic and organic layers and the other two are disposed between another pair of adjacent inorganic and organic layers, and (3) the red, green, and blue light band-pass filter films are respectively disposed between different pairs of adjacent inorganic and organic layers.

5. The OLED display according to claim 1, wherein the encapsulation layer comprises a plurality of inorganic layers and organic layers alternately stacked;
when the red, green, and blue light band-pass filter films are made of an organic material, they are embedded within the organic layers in one of the following manners: (1) the red, green, and blue light band-pass filter films are altogether embedded within an organic layer; (2) one of the red, green, and blue light band-pass filter films is embedded within an organic layer and the other two are embedded within another organic layer, and (3) the red, green, and blue light band-pass filter films are respectively embedded within different organic layers; and
when the red, green, and blue light band-pass filter films are made of an inorganic material, they are embedded within the inorganic layers in one of the following manners: (1) the red, green, and blue light band-pass filter films are altogether embedded within an inorganic layer; (2) one of the red, green, and blue light band-pass filter films is embedded within an inorganic layer and the other two are embedded within another inorganic layer, and (3) the red, green, and blue light band-pass filter films are respectively embedded within different inorganic layers.

6. The OLED display according to claim 1, wherein
the red light band-pass filter film has a transparent band between wavelengths R1 and R2; the red light emitting layer peaks at wavelength R0; R1=R0−20 nm; R2=R0+20 nm;
the green light band-pass filter film has a transparent band between wavelengths G1 and G2; the green light emitting layer peaks at wavelength G0; G1=G0−15 nm; G2=G0+15 nm;
the blue light band-pass filter film has a transparent band between wavelengths B1 and B2; the blue light emitting layer peaks at wavelength B0; B1=B0−10 nm; and B2=B0+10 nm.

7. The OLED display according to claim 1, further comprising a circular polarizer between the OLED device and the band-pass filter device.

8. The OLED display according to claim 1, wherein the band-pass filter device further comprises a transparent sheet; and the red, green, and blue light band-pass filter films are formed on the transparent sheet.

9. An OLED display manufacturing method, comprising the steps of
forming an OLED device on a substrate, where the OLED device comprises a red light emitting layer, a green light emitting layer, and a blue light emitting layer;
forming an encapsulation layer on the OLED device;
forming a band-pass filter device on a side of a lid, where the band-pass filter device comprises a red light band-pass filter film, a green light band-pass filter film, and a blue light band-pass filter film; and
joining the lid, together with the band-pass filter device, to the encapsulation layer with the red, green, and blue light band-pass filter films corresponding oppositely to the red, green, and blue light emitting layers, respectively.

10. An OLED display manufacturing method, comprising the steps of
forming an OLED device on a substrate, where the OLED device comprises a red light emitting layer, a green light emitting layer, and a blue light emitting layer;
forming an encapsulation layer on the OLED device;
forming a red light band-pass filter film, a green light band-pass filter film, and a blue light band-pass filter film, jointly as a band-pass filter device, on a side of a transparent sheet;
disposing the transparent sheet with the band-pass filter device on the encapsulation layer and with the red, green, and blue light band-pass filter films correspond oppositely to the red, green, and blue light emitting layers, respectively; and
covering the band-pass filter device by a lid.

* * * * *